United States Patent [19]

Hui et al.

[11] Patent Number: 4,746,630
[45] Date of Patent: May 24, 1988

[54] METHOD FOR PRODUCING RECESSED FIELD OXIDE WITH IMPROVED SIDEWALL CHARACTERISTICS

[75] Inventors: Chi-Hung Hui, Cupertino; Paul V. Voorde, Mountain View; John L. Moll, Palo Alto, all of Calif.

[73] Assignee: Hewlett-Packard Company, Palo Alto, Calif.

[21] Appl. No.: 908,485

[22] Filed: Sep. 17, 1986

[51] Int. Cl.[4] .................. B05D 5/12; B05D 1/32; C23C 16/00
[52] U.S. Cl. .................. 437/235; 437/238; 437/239; 437/241; 437/243; 427/271; 427/272; 427/419.3; 427/255.3; 427/255.7
[58] Field of Search .................. 427/85, 93, 94, 154, 427/399, 271, 272, 419.2, 419.3, 419.7; 357/47, 49, 50; 148/DIG. 86, DIG. 117; 437/235, 238, 241, 242, 243

[56] References Cited

U.S. PATENT DOCUMENTS 4,472,459  9/1984  Fisher et al.
4,583,281  4/1986  Ghezzo et al. .................. 427/93

OTHER PUBLICATIONS

"Isolation Technology for Scaled MOS VLSI", by W. G. Oldham, IEDM 82; CH1832-5/82/0000-02161; 1982 IEEE; pp. 216-219.
"The Swami—A Defect Free and Near—Zero Bird's—Beak Local Oxidation Process and its Application in VLSI Technology", by K. Y. Chiu, R. Fang, J. Lin; J. L. Moll, C. Lage, S. Angelos, and R. Tillman; IEDM 82; CH1832-5/82/0000-0224; 1982 IEEE: 224-227.
"Scaling Limitations of Submicron Local Oxidation Technology", by John Jui, Paul Vande Voorde, and John Moll, IEDM 85; CH2252-5/85/0000-0392; 1985 IEEE.
"Electrical Properties of MOS Devices Made With Silo Technology", by J. Hui, T. U. Chiu, S. Wong, and W. G. Oldham; IEDM 82; CH1832-5/82/0000-0220; 1982 IEEE.
"Trench Isolation Prospects for Application in CMOS VLSI", by R. D. Rung; IEDM 84; CH2099-0/84/00-00-0574; 1984 IEDM; pp. 574-577.
"CMOS Technology Using SEG Isolation Technique", by N. Endo, N. Kasai, A. Ishitani, and Y. Kurogi; IEDM 83; CH1973-7/83/0000-0031; 1983 IEEE; pp. 31-34.

Primary Examiner—Norman Morgenstern
Assistant Examiner—Margaret Burke
Attorney, Agent, or Firm—Paul L. Hickman

[57] ABSTRACT

A method for producing field oxide in a silicon substrate by forming a thin oxide layer over the surface of the substrate, forming a thin nitride layer over the thin oxide layer, forming a thick oxide over the thin nitride layer, forming a thick nitride layer over the thick oxide layer; patterning all four of the layers to espose the surface of the substrate where the field oxide is to be formed; and growing the field oxide. Preferably, before the field oxide is grown, trenches are formed into the substrate so that the upper surfaces of the field oxide are substantially planar with the upper surfaces of the substrate. The thin oxide layer minimizes bird beak formation, and eases the removal of the oxide/nitride/oxide/nitride layers. The resultant structure is both planar and bird's beak-free, and is therefore well suited to producing VLSI components having dimensions less than 0.5 microns.

13 Claims, 2 Drawing Sheets

METHOD FOR PRODUCING RECESSED FIELD OXIDE WITH IMPROVED SIDEWALL CHARACTERISTICS

BACKGROUND OF THE INVENTION

1. Field of the Invention

This invention relates generally to methods for producing integrated circuits, and more particularly to methods for producing very large scale integration (VLSI) integrated circuits.

2. Description of the Prior Art

Integrated circuits can have hundreds, thousands, or even millions of active and passive components formed on a common, semiconductor substrate. Usually, adjacent components must be electrically isolated from each other to avoid shorts through the substrate which would impair the circuit's functioning. This inter-component isolation typically takes the form of "field oxide" regions comprised of relatively thick layers of silicon dioxide ($SiO_2$).

Isolation in large scale integration (LSI) and very large scale integration (VLSI) circuits is most often accomplished by a process known as local oxidation (LOCOS). With the LOCOS process, a thick layer of oxide is thermally grown over the surface of a semiconductor substrate, and then a thick layer of silicon-nitride ($Si_3N_4$) is deposited over the oxide layer. The nitride and oxide layers are patterned by conventional techniques, and field oxide is grown over and into the exposed surfaces of the substrate.

The LOCOS process has many advantages. For one, it is a relatively simple, and is well-adapted to mass production techniques. In addition, the LOCOS process is advantageous in that it provides self-aligned field implants.

For a variety of reasons, the LOCOS process cannot presently be used when the individual components have dimensions smaller than about one micron. One of the problems with using the LOCOS process in an attempt to produce sub-micron components is the so-called "bird's beak" effect where the field oxide diffuses into the oxide layers covering the active regions of the component in a pattern that looks, in cross-section, like a bird's beak. This diffusion pinches off the active region of the component and impairs or destroys its proper functioning.

Another problem with using the LOCOS process in an attempt to produce sub-micron components is that the resultant surface topography is not sufficiently planar for subsequent VLSI lithography and anisotropic etching steps. This problem is discussed in "Isolation Technology for Scaled MOS VLSI", by W. G. Oldham, IEDM Technical Digest, pp. 216–219, December 1982.

A process known as side wall mask isolation (SWAMI) has been suggested to partially solve the bird's beak problem. As described in "The SWAMI—A Defect free and Near-Zero Bird's Beak Local Oxidation Process and its Application in VLSI Technology", by K. Y. Chiu, et al., IEDM Technical Digest, pp. 224–227, December 1982, the SWAMI process involves silicon etching and the formation of nitride on the sidewalls of the field oxide to prevent diffusion of the field oxide into the oxide layers covering the active regions of the integrated circuit components. By using SWAMI techniques, component sizes can be shrunk to approximately 0.8 microns.

However, the SWAMI process is relatively more complex than the more standard LOCOS process, which makes integrated circuits made by the SWAMI process relatively more expensive. Furthermore, it has been found that for isolation spacing below one micron, the field oxide thickness is a direct function of the opening size in the silicon substrate. Since the silicon openings with the SWAMI process are quite small due to the nitride applied to the side wall areas, the field oxide tends to be extremely thin, and may not provide adequate component isolation. An article discussing this problem is "Scaling Limitations of Sub-Micron Local Oxidation Technology", by J. Hui, et al., IEDM Technical Digest, pp. 392–395, December 1985.

A process known as sealed interface local oxidation (SILO) is described in "Electrical Properties of MOS Devices Made With SILO Technology" by J. Hui. et al., IEDM Technical Digest, pp. 220–223, December 1982. The SILO process attempts to solve the bird's beak problem by providing a blocking structure including a thin nitride layer formed over the components' active regions, a thick oxide layer formed over the thin nitride layer, and a thick nitride layer formed over the thick oxide layer. The thin nitride layer prevents the diffusion of oxygen into the thick oxide layer, and thus substantially eliminates the bird's beak effect.

Unfortunately, the thin nitride layer tends to cause crystal defects in the active regions of the components, and is hard to remove from the silicon substrate for subsequent processing. Furthermore, the field oxide grown by the SILO process creates an uneven surface topology which, as was explained previously, is a poor surface for subsequent VLSI lithography and anisotropic etching steps.

SUMMARY OF THE INVENTION

An object of this invention is to provide a production method which can result in smaller integrated circuit components and thus denser integrated circuits.

Another object of this invention is to provide a production method for producing field oxide layers with improved characteristics for integrated circuits.

A further object of this invention is to provide a production method for producing field oxide layers having upper surfaces which are substantially flush with the upper surfaces of a semiconductor substrate so as to present a smooth, planar surface for subsequent VLSI lithography and anisotropic etching steps.

A still further object of this invention is to provide a production method which substantially reduces the bird's beak effect.

Briefly, the method of the present invention includes the formation of a thin oxide layer over the surface of a silicon substrate, the formation of a thin nitride layer over the thin oxide layer, the formation of a thick oxide layer over the thin nitride layer, and the formation of thick nitride layer over the thick oxide layer. The oxide/nitride/oxide/nitride layers are then patterned to expose the surface of the silicon substrate where the field oxide is to be formed, and the silicon substrate is exposed to an oxidizing atmosphere at elevated temperatures to form the field oxide layer. Preferably, prior to the formation of the field oxide layer, the surface of the silicon substrate is etched to produce trenches so that the upper surfaces of the field oxide layers are substantially level with the surface of the silicon substrate.

An advantage of the method of the present invention is that integrated circuit components as small as 0.5 microns can be produced on a semiconductor substrate.

Another advantage of this invention is that the bird's beak effect is very much reduced.

Yet another advantage of this invention is that its implementation is relatively straight-forward, and can be accomplished with commercially available integrated circuit manufacturing equipment.

A still further advantage of this invention is that the resultant surface is substantially planar, which greatly reduces the problems in the formation of subsequent layers.

These and other objects and advantages of the present invention will be apparent to those skilled in the art after reading the following descriptions and studying the various figures of the drawing.

DETAILED DESCRIPTION OF THE PREFERRED EMBODIMENT

Figure 1A:
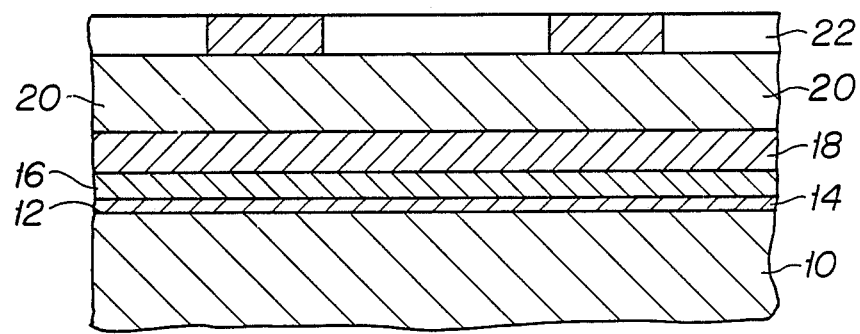
FIG. 1A is a cross-section of a portion of an integrated circuit component illustrating the various layers which are to be subsequently patterned to form blocking structures used in the process of the present invention.

Referring to FIG. 1A, an initial step in the process of the present invention (which will be referred to as a recessed SILO process) is to clean and prepare a silicon substrate 10 so that it has a smooth, planar upper surface 12. Next, a thin layer of oxide 14 is formed over surface 12 to a thickness of approximately 2-5 nanometers (nm). A thin nitride layer 16 is then deposited over the thin oxide layer 14 by a low pressure chemical vapor deposition (LPCVD) technique to a thickness of approximately 10 nm. Subsequently, a thick oxide layer 18 is deposited by an LPCVD process to a thickness of approximately 40 nm, and a thick nitride layer 20 is deposited over the thick oxide layer 18 by an LPCVD process to a thickness of 150 nm. A photoresist layer 22 is applied over the thick nitride layer 20, which is then exposed and developed to make the patterned mask illustrated. The methods for applying, exposing, and developing photoresist layers such as the photoresist layer 22 are well-known to those skilled in the art.

Figure 1B:
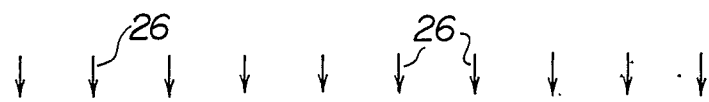
FIG. 1B is a cross-section of the integrated circuit component illustrating the blocking structures after they have been patterned; illustrating the etching of the silicon substrate to form trenches; and still further illustrating the boron implantation of the silicon substrate.
Figure 1B:
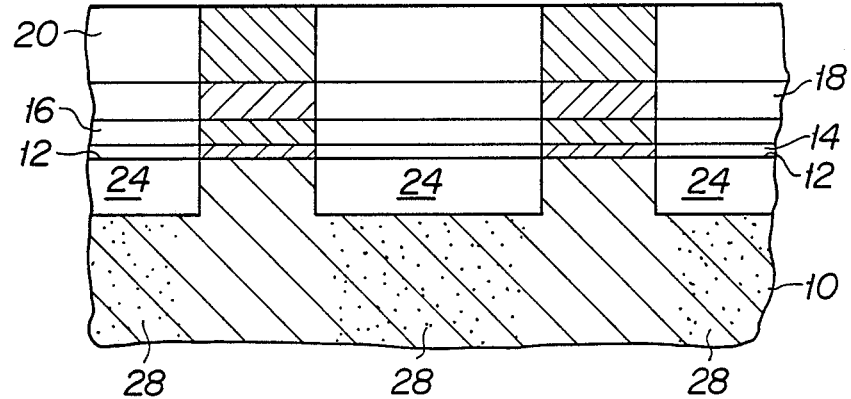

In FIG. 1B, the layers 14, 16, 18, and 20 have been anisotropically etched in accordance with the pattern of the mask of photoresist 22. Furthermore, the upper surface 12 of silicon substrate 10 has been anisotropically etched to a depth of 100-150 nm to provide trenches 24 where field oxide regions are to be subsequently grown. Also, ions 26 of a doping substance are preferably implanted into the substrate 10 to produce heavily doped regions 28. In the case of a P-type silicon substrate, boron has been found to be a good doping substance.

Figure 1C:
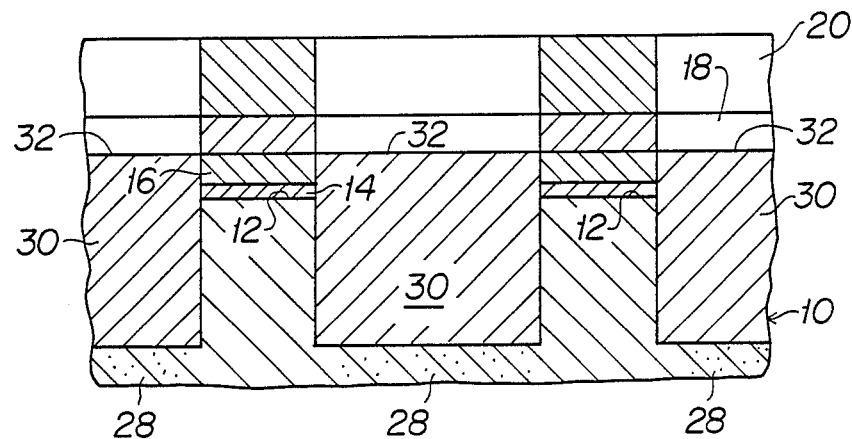
FIG. 1C is a cross-section of the integrated circuit component after the field oxide has been grown.

In FIG. 1C, field oxide regions, 30 are shown having upper surfaces 32 which are higher than upper surface 12 of substrate 10. Preferably, the field oxide 30 is grown to a thickness of 600 nm in an oxidizing steam atmosphere at 950° C. It should be noted that the field oxide 30 grows both into and above substrate 10 from within trenches 24.

Figure 1D:
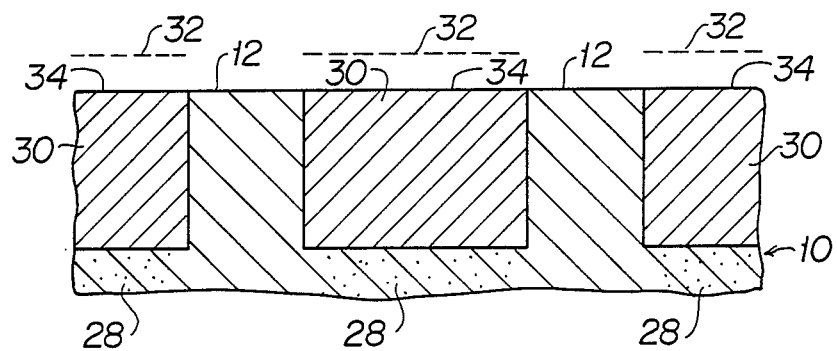
FIG. 1D is a cross-section of the integrated circuit component after the blocking structures have been removed.

As mentioned previously, the intermediate stage shown in FIG. 1C, the upper surfaces 32 of the field oxide regions 30 are higher than the upper surface 12 of the silicon substrate 10. An etching process is then performed to remove layers 14, 16, 18, and 20. As seen in FIG. 1D, the etching process that removed layers 14, 16, 18, and 20 also removed upper portions of field oxide regions 30 so that their upper surfaces 34 are lower than their previous upper surface levels 32. It has been found that approximately 100 nm of the field oxide is etched away during the removal of layers 14, 16, 18, and 20, which brings the upper surfaces 34 into substantial alignment with the upper surface 12 of substrate 10. In other words, due to a combination of the formation of trenches 24 and partial field oxide removal which accompanies the removal of layers 14, 16, 18, and 20, a substantially planar surface is formed comprising the upper surfaces 34 of the field oxide regions 30 and the upper surfaces 12 of silicon substrate 10. This smooth, planar surface is ideal for use in sub-micron VLSI photolithography and anisotropic etching steps.

Each of layers 14, 16, 18, and 20 serves an important purpose in the process of the present invention. The thick nitride layer 20 (which should be at least 100 angstroms thick to prevent pin-holes) blocks the implantation of the ions 26. Furthermore, thick nitride layer 20, due to its stiffness, inhibits the growth of the oxide layer 18 below it by providing a "clamp down" effect. The thick oxide layer 18 is needed to shield the silicon substrate 10 from the stress of the thick nitride layer 20. Preferably, the thick oxide layer is approximately 400 angstroms thick. If the thick oxide layer 18 was made to be less than 100 angstroms thick, the stress of thick nitride layer 20 would be transmitted through the layers 18, 16, 14 to the silicon substrate 10, causing defects. The thin nitride layer 16 shields the thick oxide layer 18 from the field oxide regions 30. Without the thin nitride layer 16, the field oxide 30 would grow bird's beaks into the sides of thick oxide 18, as was the case in the prior art. Finally, thin oxide layer 14 relieves the stress caused by thin nitride layer 16, and makes it easier to remove the layers 4, 16, 18, and 20.

It should be noted that a small bird's beak is formed into thin oxide 18 during the growth of field oxide 30. However, due to the thinness of thin oxide layer 14, the bird's beak effect is very small, and is completely removed by the subsequent etching steps.

The method of the present invention differs from the aforementioned SILO process in two major ways. First, the process of the present invention includes the thin oxide layer which is essential for the formation of a defect-free, trenched field oxide structure. With the thin, thermal-nitride layer of the prior art SILO process, the structure is bird's beak-free, but the field oxidation profile has a steep re-entrant angle causing substantial stress and crystal defects in the substrate. The thin oxide 14 of the present invention allows for the formation of a small bird's beak, permitting the oxidation profile to relax into a gentle shape, reducing oxidation stress and defects.

A second difference between the process of the present invention and the SILO process is the formation of the recesses or trenches 24 which enable the field oxide portions to provide a completely planar upper surface in conjunction with the unetched portions of the substrate. Since the small bird's beak formed in the thin oxide layer 14 is etched away during the removal of the oxide/nitride/oxide/nitride layers, the final isolation structure as seen in FIG. 1D is both bird's beak-free and planar.

It should be noted that many publications describe the details of common techniques used in the fabrication process of integrated circuit components. See, for example, *Semiconductor and Integrated Circuit Fabrication Techniques,* published by Preston Publishing Co., Inc. These techniques can be generally employed in the fabrication of the structures of the present invention. Moreover, the individual manufacturing steps can be performed using commercially available integrated circuit fabrication machines. As specifically necessary to an understanding of the present invention, approximate technical data for the preferred embodiments are set forth based upon current technology. Future developments in this art may call for appropriate adjustments, as would be obvious to one skilled in the art.

While this invention has been described with reference to a specific preferred embodiment, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A method for producing field isolation regions for a silicon-based semicondutor substrate comprising:
    forming four-layer blocking structures over field regions of said substrate by:
    forming a first insulation layer of a silicon oxide over a surface of said substrate;
    forming a first inhibiting layer of a silicon nitride over said first insulation layer;
    forming a second insulation layer of a silicon oxide over said first inhibiting layer, said second insulation layer being thicker than said first insulation layer;
    forming a second inhibiting layer of a silicon nitride over said second insulation layer, said second inhibiting layer being thicker than said first inhibiting layer;
    patterning said first insulation layer, said first inhibiting layer, said second insulation layer, and said second inhibiting layer such that portions of said substrate surface where said isolation regions are to be formed become uncovered, and such that remaining portions of said substrate surface are covered by four layer insulation/inhibiting/insulation/inhibiting blocking structures; and
    forming field isolation regions at portions of said surface of said substrate which are not covered by said blocking structures.

2. A method as recited in claim 1 wherein said first insulation layer and said second insulation layer are formed by vapor deposition.

3. A method as recited in claim 1 wherein said first inhibiting layer and said second inhibiting layer are formed by vapor deposition.

4. A method as recited in claim 1 wherein said isolation regions are grown into said surface of said substrate.

5. A method as recited in claim 1 wherein said isolation regions are grown in an oxidizing environment at higher than ambient temperatures.

6. A method as recited in claim 1 further comprising implanting a doping substance into said substrate where the isolation regions will be subsequently formed.

7. A method as recited in claim 6 further comprising forming trenches in said surface of said substrate where said isolation regions are to be subsequently formed, such that the upper surfaces of said isolation regions and said surface of said substrate are substantially planar.

8. A method as recited in claim 1 further comprising forming trenches in said substrate where said isolation regions are to be subsequently formed, such that the upper surfaces of said isolation regions and said surface of said substrate are substantially planar.

9. A method for producing field oxide for a silicon substrate, said method comprising:
    forming a first silicon oxide layer over said surface of said substrate;
    forming a first silicon nitride layer over said first oxide layer;
    forming a second silicon oxide layer over said first nitride layer, said second oxide layer being thicker than said first oxide layer;
    forming a second silicon nitride layer over said second oxide layer, said second nitride layer being thicker than said first nitride layer;
    patterning said first oxide layer, said first nitride layer, said second oxide layer, and said second nitride layer to expose said surface of said substrate where said field oxide is to be formed such that remaining portions of said substrate surface are covered by a four layer oxide/nitride/oxide/nitride structure; and
    forming said field oxide.

10. A method as recited in claim 9 further comprising forming trenches into said surface of said substrate where said field oxide is to be subsequently formed.

11. A method as recited in claim 9 further comprising implanting boron into said substrate where said field oxide is to be subsequently formed.

12. A method as recited in claim 9 wherein said first oxide layer, said first nitride layer, said second oxide layer, and said second nitride layer are formed by vapor deposition; and wherein said field oxide is grown in an oxidizing enviroment at elevated temperatures.

13. A method as recited in claim 9 further comprising removing said first oxide layer, said first nitride layer, said second oxide layer, and said second nitride layer after forming said field oxide, whereby the upper surfaces of said field oxide are substantially planar with said surface of said substrate.

* * * * *